(12) United States Patent
Brady et al.

(10) Patent No.: US 6,529,385 B1
(45) Date of Patent: Mar. 4, 2003

(54) COMPONENT ARRAY ADAPTER

(75) Inventors: Gary W. Brady, Aloha, OR (US); Harry L. Hampton, III, Aloha, OR (US); Michael T. White, Hillsboro, OR (US); Ashok N. Kabadi, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/382,348

(22) Filed: Aug. 25, 1999

(51) Int. Cl.$^7$ ................................................ H05K 1/16

(52) U.S. Cl. .................. 361/766; 361/803; 361/735; 361/736; 361/760; 361/761; 361/763; 361/764; 361/782; 361/811; 361/785

(58) Field of Search ................................. 361/766, 760, 361/821, 764, 735, 790, 736, 748, 763, 767, 782, 792, 811, 803, 783; 439/620, 607, 636, 637, 626, 631, 628, 803, 736, 790, 735, 760–761, 763, 764, 782, 811, 766, 785

(56) References Cited

U.S. PATENT DOCUMENTS

| | | | | |
|---|---|---|---|---|
| 5,057,041 A | * | 10/1991 | Yu et al. ...................... | 439/620 |
| 5,213,522 A | * | 5/1993 | Kojima ........................ | 439/620 |
| 5,624,277 A | * | 4/1997 | Ward .......................... | 439/620 |
| 5,761,036 A | * | 6/1998 | Hopfer et al. ............... | 361/704 |
| 6,142,831 A | * | 11/2000 | Ashman et al. ............. | 439/620 |

\* cited by examiner

*Primary Examiner*—David Martin
*Assistant Examiner*—Thanh Y. Tran
(74) *Attorney, Agent, or Firm*—Schwegman, Lundberg, Woessner & Kluth, P.A.

(57) ABSTRACT

Apparatus and methods for connecting a device to an integrated circuit. The apparatus includes an insulating substrate that has two major sides and a number of sites for housing components. Each site has a first node on one of the two sides of the insulating substrate and a second node on the other of the two sides of the insulating substrate. Each site also has components that are aligned normal to the sides of the insulating substrate and are connected to the nodes at the site. Such apparatus are useful as adapters for testing an integrated circuit, such as connecting a test device to the integrated circuit with the adapter and observing and/or driving signals through the adapter.

36 Claims, 6 Drawing Sheets

COMPONENT ARRAY ADAPTER

TECHNICAL FIELD OF THE INVENTION

The present invention is related to integrated circuit interconnection, and more particularly to an array of components for connecting integrated circuits to other devices.

BACKGROUND OF THE INVENTION

In today's world of high technology, demand for increased computing power is on the rise. Applications continue to increase in complexity and each increase in speed and efficiency to meet the new complexities is followed by a new demand for more capability. In this quickly advancing process, the density and speed of signals used on integrated circuits has escalated. Nowhere is this more apparent than in microprocessor and memory data buses. The increased density and speed has made testing of, and interconnection to, new technologies more difficult with each step because of difficulties in connecting testing or other devices to the high density signals without adversely affecting the test results or integrated circuit performance.

One solution used is to take a typical processor socket, lift it up, and put an interposer between the socket and the signals. The signals then need to be routed out to a buffer or attenuator before being connected to a probe for testing or to another device. The routing of the signals out to the buffer or attenuator adds interconnect distance to the signals and thereby significantly decreases signal performance which limits the effectiveness of testing or other interconnection activities.

Another solution is to connect the testing or other devices into extra connectors attached to the signals. This used to be an adequate solution when signal and bus speeds were 100 MHz or less. However, with bus and signal speeds surpassing 400 MHz, this is no longer a feasible solution without undesirable impact on the signals. This impact will have the same effect as the routing length problems above and severely limit the effectiveness of the desired testing and integrated circuit performance.

It is possible to mount resistors flat onto the circuit board to act as the first stage (series resistor) of a probe attenuator/isolator for each signal that limits the effect on the bus or signal. This process can be difficult in high density signal areas because of the lack of space for mounting the resistors, or the need to use extremely small resistors for which there is currently no qualified circuit board mounting process. Additionally, this solution still requires the signals to be routed out from high density areas. The routing adds significant interconnect lengths before reaching the probe and the associated vias reduce the effectiveness of the power and ground planes. The added interconnect length introduces parasitics that degrade testing accuracy and integrated circuit capabilities and limits the effectiveness of the solution.

Another solution to the signal degradation problem is to use ohmic printed circuit board layers. While this method may not degrade the signals and eliminates the problem of fitting resistors onto the circuit board, there are new problems. Ohmic layers have increased variations in resistor tolerance which sacrifices isolation and performance. Additionally, there remains the, need to route the isolated signals out to a probe connection that introduces long interconnect lengths and the associated degradation in testing or integrated circuit performance from parasitics. Finally, ohmic layers are expensive making them generally undesirable.

Thus, what is needed in the art is an apparatus and method for low cost, minimally invasive connectivity to high speed and high density electrical signals that can also facilitate accurate test results.

SUMMARY OF THE INVENTION

One embodiment includes an interconnect device having an insulating substrate having first and second sides and a plurality of sites. Each site includes a first node on the first side, a second node on the second side and at least one component connected between the first and second nodes. The components include active or passive components. Each component is substantially normal to the first and second sides of the insulating substrate.

Another embodiment includes a method for testing an integrated circuit. The method includes connecting at least one test probe to an adapter. The adapter includes an insulating substrate having first and second sides and a plurality of sites. Each site includes a first node on the first side, a second node on the second side and at least one component connected between the first and second nodes. The components include active or passive components. Each component is substantially normal to the first and second sides of the insulating substrate. Each site further includes a first electrical connector connected to the second node. The method further includes connecting the adapter to the integrated circuit using the first electrical connectors of the plurality of sites and testing the integrated circuit using a test unit attached to each of the test probes.

A further embodiment includes an interconnect device. The interconnect device includes an insulating substrate having first and second substantially parallel, planar surfaces. The insulating substrate further has a plurality of holes passing through the insulating substrate such that a center line of each of the plurality of holes is substantially normal to the first and second planar surfaces. A plurality of surface mount electrical components, having a body with first and second conductive interconnects located at distal ends of the body, are located in the plurality of holes such that the first conductive interconnect of each of the plurality of surface mount electrical components is located proximate to, the first planar surface and the second conductive interconnect of each of the plurality of surface mount electrical components is located proximate to the second planar surface.

The invention further includes other apparatus and methods of varying scope.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural, electrical and logical changes may be made without departing from the scope of the present invention.

The term normal, as used in this application, is defined as one element forming an approximately 90 degree angle with another element or referenced surface. It is understood by those of skill in the art that industrial processing may inherently induce deviations from normal, and that deviations of a few degrees are generally acceptable. Directions, such as "top," "bottom" and "lateral" are defined with respect to the conventional plane or surface of the substrate, regardless of the orientation of the substrate.

Figure 1A:
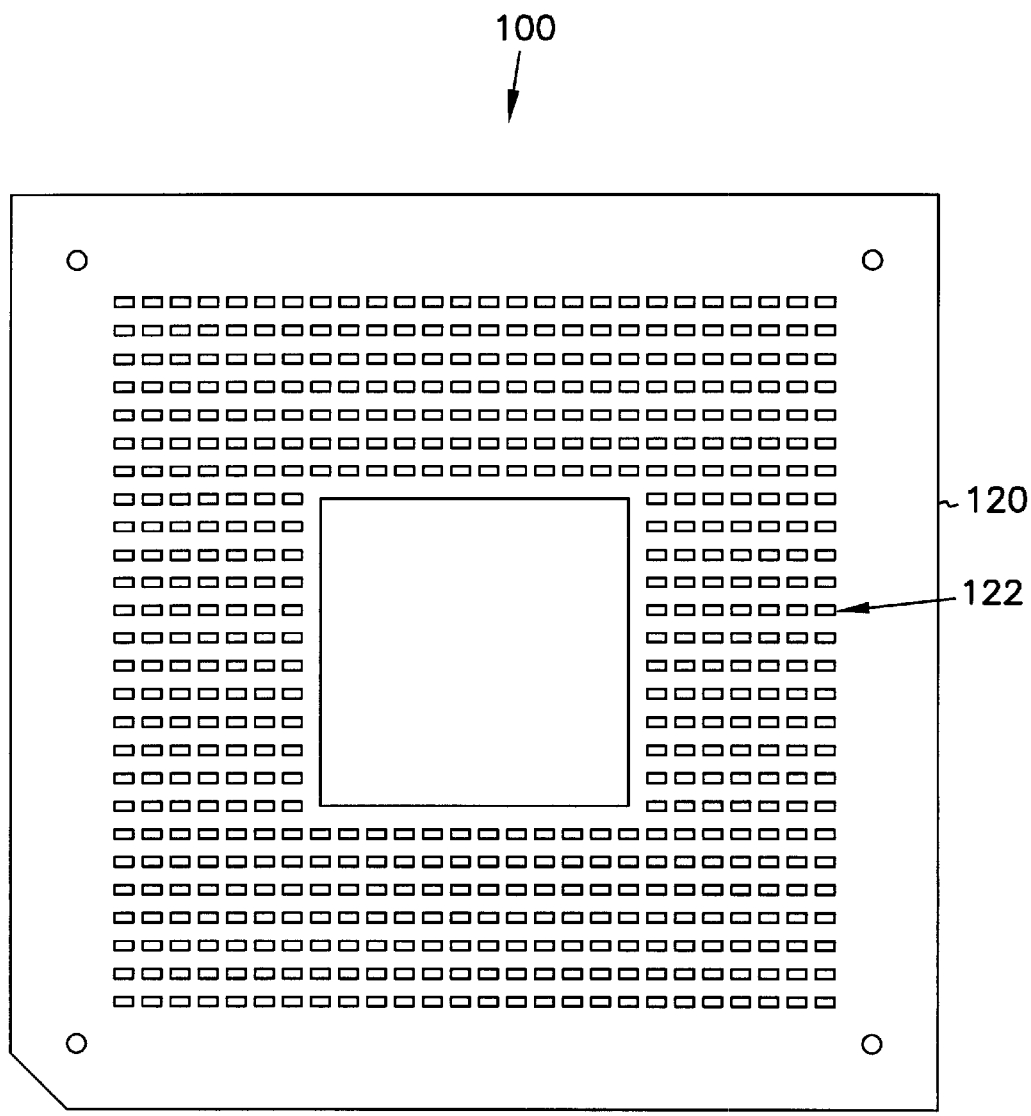
FIG. 1A is an overview illustrating one embodiment of the interconnect device of the present invention.
Figure 1B:
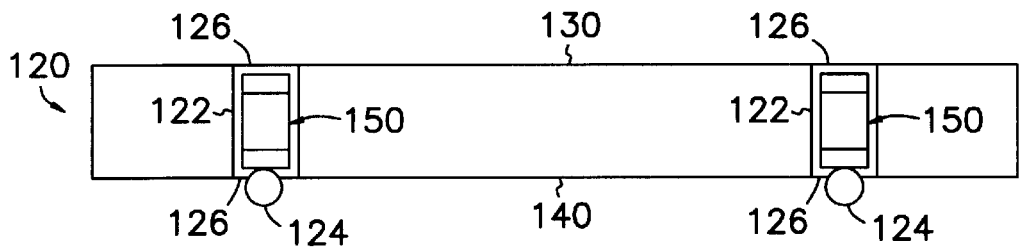
FIG. 1B is a cross-sectional view of the interconnect device shown in FIG. 1A.

FIG. 1A is an overview illustrating one embodiment of the interconnect device 100 of the present invention. Interconnect device 100 has an insulating substrate 120 that has sites 122 for locating components 150 (as shown in FIG. 1B). For one embodiment, the insulating substrate 120 is constructed of a material which has properties giving it good mechanical stability. For another embodiment, the insulating substrate 120 is constructed of a material that has physical qualities that facilitate solder joints forming correctly and also facilitate solder joints that do not crack after they are formed. For another embodiment, the insulating substrate 120 is constructed of a material that facilitates the insulating substrate 120 in not warping when solder joints are formed. Additionally, the insulating substrate 120 must have insulating properties. The insulating properties must be such that each component inserted into the insulating substrate 120 at a site 122 is substantially electrically isolated from components located at other sites 122 absent an intended electrical connection. It is also desired that the insulating substrate 120 have a thermal expansion rate that is substantially equal to the thermal expansion rate of devices or circuit boards to which the insulating substrate may be connected.

For one embodiment, the insulating substrate 120 contains FR4. FR4 is a woven glass cloth construction laminate with an epoxy resin binder that conforms to military specification 13949, revision F, type GF. Construction of FR4 is well known to those skilled in the art and can be accomplished through any suitable process. FR4, while being a good choice for the substrate, is relatively expensive to machine and is not a moldable material which requires extra processing to form the sites 122. For another embodiment, the insulating substrate 120 contains Polyphenylene Sulphide (PPS). PPS is a moldable material that makes the molding of the sites 122 for locating the components 150 (as shown in FIG. 1B) easier, making it a generally more desirable material. Additionally, PPS is relatively inexpensive while having the desired physical properties discussed above and provides the needed insulation of the components 150 when no electrical connection is intended. PPS also has a thermal expansion rate that is substantially similar to that of most devices and circuit boards to which it is likely to be connected.

The insulating substrate 120 is shaped to conform to the contact footprint to which it will be connected. For one embodiment, the insulating substrate 120 is shaped to conform to a processor socket. For another embodiment, the insulating substrate 120 is shaped to, conform to any multi-contact support footprint. It is to be understood that the above list of shapes is not a complete list of shapes suitable for the insulating substrate 120.

FIG. 1B shows a cross-sectional view of one embodiment of the interconnect device 100 shown in FIG. 1A. The insulating substrate 120 is shown to have a first or top side 130 and a second or bottom side 140 as major sides of the insulating substrate 120. The top side 130 and the bottom side 140 are substantially parallel, planar surfaces. Located on the top side 130 and the bottom side 140 at each of the sites 122 are nodes 126. Sites 122 are generally holes passing through the insulating substrate 120. A center line of each site 122 extending from the top side 130 to the bottom side 140 is substantially normal to the top side 130 and the bottom side 140.

The insulating substrate 120 also has components 150 located in at least one site 122. For one embodiment, the components 150 could be active components and/or passive components. As used in this description, conductors are not active or passive components. For another embodiment, the components 150 could be resistors, capacitors, inductors, diodes, or any other active or passive component. For one embodiment, the components 150 may be surface mount electrical components having a body and conductive interconnects located at distal ends of the body. For a further embodiment, one or more sites 122 may contain a conductor as a component 150. The components 150 are aligned substantially normal to both the top side 130 and the bottom side 140 of the insulating substrate 120. By having normal alignment, the components generally take up less area so more components can be placed side by side in the same amount of space. This tight alignment of the components is ideal for facilitating connections to high density signals on a circuit board. Another advantage of the normal alignment is a short connection distance from the component to any testing or probing equipment. The short connection distance significantly reduces parasitics associated with long interconnect lengths.

For one embodiment, there is a single component 150 in at least one site 122. Each component 150 is connected to each node 126 of the site 122 at which it is located. As an example, the first conductive interconnect of the component 150 could be connected to a node 126 on the top side 130 and the second conductive interconnect of the component 150 could be connected to a node 126 on the bottom side 140. This single component embodiment allows for simple circuits that perform functions including terminating signals and providing a first stage series resistor for a test probe attenuator/isolator. Single components may also be used for power delivery to a signal for activities such as driving a desired signal. It is understood that this is not a complete list of uses for single components and many other uses of single components will be apparent to those skilled in the art and are, therefore, not included in detail here.

For another embodiment, there are multiple components 150 at each site 122. The multiple components 150 at each site 122 can be connected together in series. This allows for the components 150 to form complex circuitry for multiple functions, such as terminating signals, filter functions, and bypass capacitances. Each complex function formed has its input and output connected to the nodes 126 of the site 122 where it is located. In creating complex circuits there is a space tradeoff. There is a corresponding increase in the space needed to house components 150 as the circuit gets more complex with more components 150 in series. This increase in space may require a thicker substrate 120 as more components 150 are to be placed in series. It is also understood that the above list of circuits is not a complete list of circuits that can be created from multiple components and many other circuits will be apparent to those skilled in the art and are, therefore, not recited in detail here.

For yet another embodiment, multiple sites 122 are connected in parallel. The parallel connecting of multiple sites can be used with either single components 150 at each site, multiple components 150 at each site or some combination of single and multiple components 150. The parallel connecting of multiple sites 122-allows for the creation of additional complex circuitry, to include filters, amplifiers, integrators and differentiators. Each complex function has its inputs and outputs connected to the nodes 126 of the sites 122 where the complex function is implemented. It is also understood that the above list of circuits is not a complete list of circuits that can be created from components in parallel, series or a combination of both and many other circuits will be apparent to those skilled in the art and are, therefore, not recited in detail here.

For another embodiment of the interconnect device 100, electrical connectors 124 are connected to each node 126 on the bottom side 140 of the insulating substrate 120. For one embodiment, the electrical connectors 124 are solder balls. The solder balls can be formed from a standard solder, such as 63% tin (Sn) and 37% lead (Pb). In general, electrical connectors 124 can be any conductive material known to those of skill in the art. The process for attaching electrical connectors 124 to the nodes 126 is well known to those of skill in the art and is, therefore, not described in detail here.

Figure 1C:
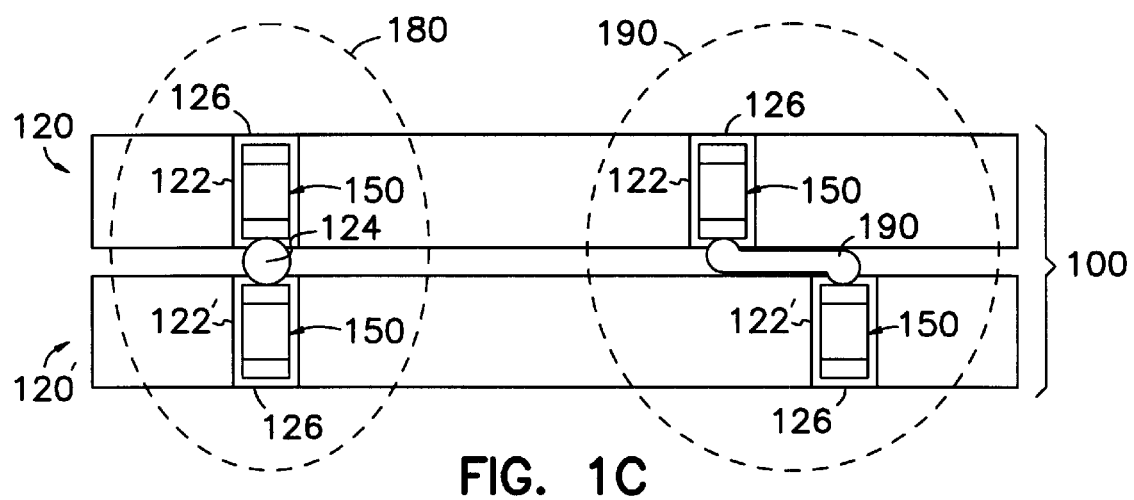
FIG. 1C is a cross-sectional view of one embodiment of an interconnect device with multiple insulating substrates and showing the interconnection of sites.

FIG. 1C shows another embodiment where multiple insulating substrates may be used to achieve the advantages described above related to multiple components 150 located at each site. In addition; multiple insulating substrates may be used to connect multiple components 150 in parallel as well as senes, or a combination of both. Multiple insulating substrates 120 and 120' with either'single or multiple components 150 at each site 122 are connected together to create complex circuitry. For one embodiment, the connecting of the multiple insulating substrates 120 and 120' is in-line 180, where site 122 for a first insulating substrate 120 is connected to its corresponding site 122 on a second insulating substrate 120. For another embodiment, the connecting of the insulating 120 and 120' is offset 190. If the connecting of the insulating substrates 120 and 120' is offset, a first site 122' for a first insulating substrate is connected to a second site 122' on a second insulating substrate 120 that does not correspond to the first site 122 on the first insulating substrate 120, i.e., the first site 122 is laterally displaced from the second site 122. The offset connections result in a different assignment of signals to sites at the entry and exit points of the interconnect device 100.

To produce the interconnect device 100 shown in FIG. 1A, an insulating substrate is formed. One method of forming the substrate is to use PPS and mold the material into the desired shape. While molding the PPS into shape, holes are molded at each site 122 to house the components 150. The spacing from a first site 122 to a second site 122 is limited by the size of the components 150 that will be housed at each site. For one embodiment, the sites 122 are placed 50 thousandths of an inch from one another, center to center, to house standard 0603 resistors. For another embodiment, the sites 122 are placed 40 thousandths of an inch from one another to house standard 0402 resistors. For another embodiment, the sites 122 are placed 30 thousandths of an inch from one another to house standard 0201 resistors. For one embodiment, the molded holes are beveled from the top side 130 to the bottom side 140 to make inserting the components 150 easier. The molded holes can be in a variety of shapes including cylindrical or rectangular. For one embodiment, cylindrical holes are used in combination with standard rectangular 0603 resistors as the components 150. This combination can provide improved performance because the insulating substrate makes less contact with the resistors thereby creating less stray capacitance. For another embodiment, rectangular holes are used for rectangular components 150 and cylindrical holes are used for cylindrical components 150 to facilitate assembly loading of the components.

The next step in producing the interconnect device 100 is the insertion of components 150 into the molded holes. For one embodiment, a component 150 is selected for insertion into the molded holes of the insulating substrate 120. For another embodiment, a complex circuit of more than one component 150 is selected. After selecting a component 150, the holes on the insulating substrate 120 where the selected component is not to be placed are masked off with a first mask. The masked insulating substrate 120 is then placed on a vibrating table with a number of the chosen components on the top side 130 of the insulating substrate 120. The insulating substrate 120 is then vibrated until each of the unmasked holes are filled with the chosen component. Alignment of the components 150 is not a concern as long as the components 150 operate the same regardless of orientation and as long as the components 150 are close to normal with the top side 130 of the insulating substrate 120. The excess components 150 not inserted into the unmasked holes are removed. The inserted components 150 are then pressed into the insulating substrate to secure the components 150 in their sites with the first conductive interconnect located proximate to the top side 130 and the second conductive interconnect located proximate to the bottom side 140. The first mask is replaced with a new mask for the next chosen component and the process is repeated until all of the holes are filled with a component 150 or left unfilled, as desired.

Another possibility for constructing the interconnect device is to use a pick and place machine. Pick and place machines are known in the art and are not described in detail here. For one embodiment, a pick and place machine is used to selectively place individual components 150 into holes at sites 122. For another embodiment, a pick and place machine is used to place multiple components 150 on top of one another at a site 122. A pick and place machine may be advantageous for forming complex circuit combinations of components 150 where the orientation of the components 150 in the holes affects functionality of the circuit.

Figure 2A:
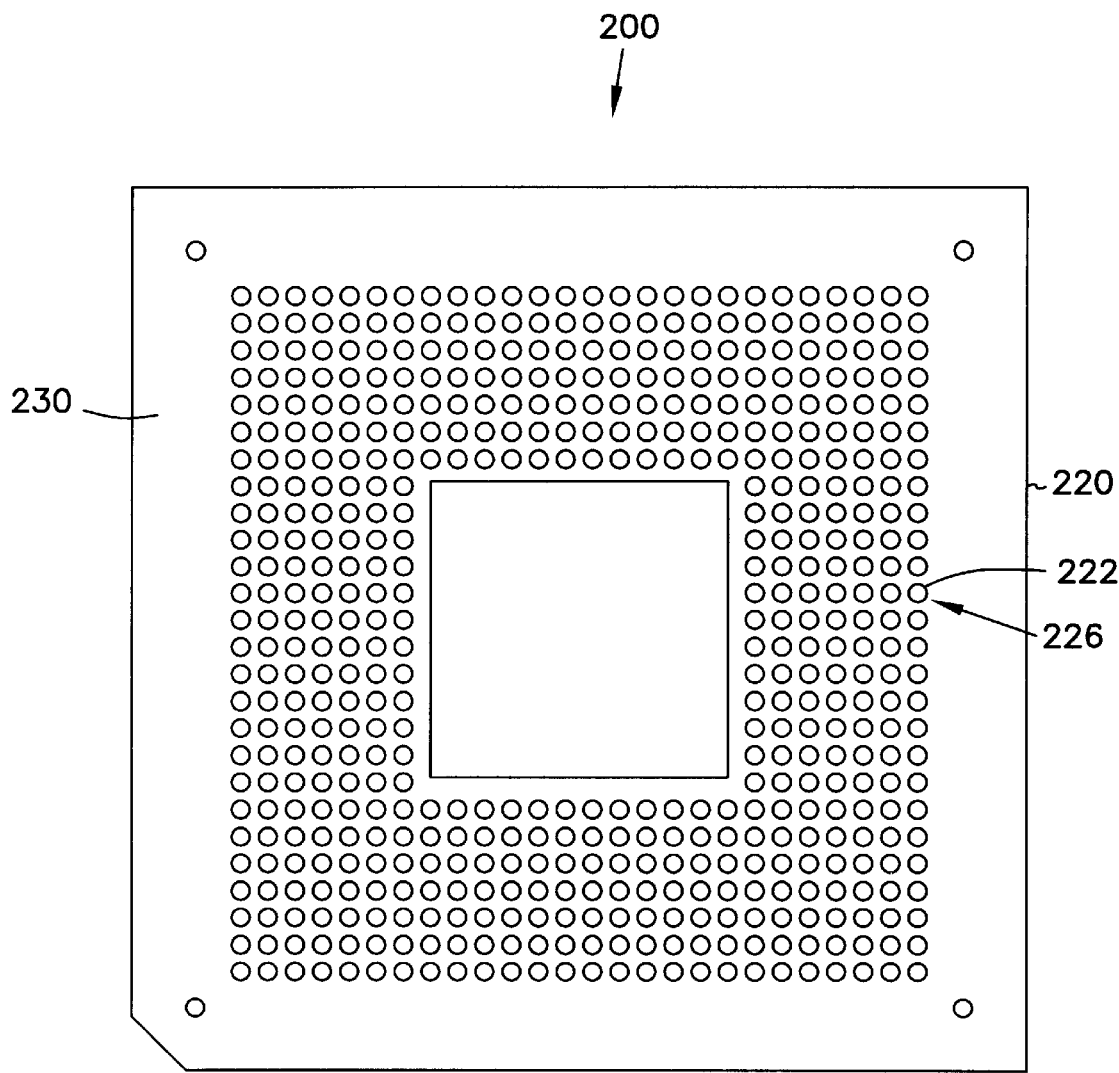
FIG. 2A is an overview of one embodiment of an interconnect system according to the present invention.

FIG. 2A illustrates a top view of one embodiment of an interconnect system 200. For one embodiment, electrical connectors 222 are connected to the top side 230 of the insulating substrate 220. For one embodiment, the electrical connectors are standard socket pins similar to those found on a standard Ball Grid Array (BGA) socket. BGA adapters are well known in the art and are not detailed here. Each electrical connector 222 is connected to a node 226 on the top side 230 of the insulating substrate 220 to provide a point for other devices to connect to the components in the insulating substrate 220. For another embodiment, a standard BGA socket is connected to the top side 230 of the insulating substrate 220 using the electrical contacts, often standard BGA solder balls, attached on the bottom side of the BGA socket. The electrical contacts are connected to each node 226 on the top side 230 of the insulating substrate 220. The electrical connectors, often socket pins, on the top side of the BGA socket perform the same function as the electrical connectors 222 described above.

Figure 2B:
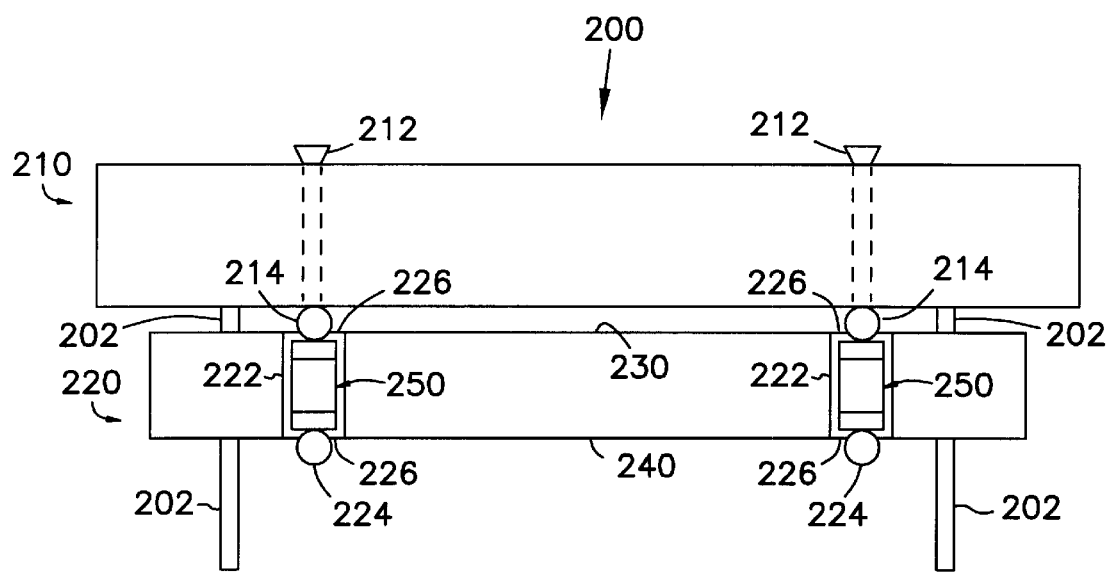
FIG. 2B is a cross-sectional view of the interconnect system shown in FIG. 2A.

FIG. 2B illustrates a side view of one embodiment of the interconnect system 200 shown in FIG. 2A. For one embodiment, the interconnect system 200 has a standard BGA socket 210 and an insulating substrate 220. The BGA socket 210 also has electrical contacts, often standard solder balls, 214 on the bottom side for connecting the BGA socket to the nodes 226 of the insulating substrate 220. At least one electrical contact 214 is connected to at least one of the nodes 226 on the top side 230 of the insulating substrate 220, thereby connecting it to the component 250 located at the site 222 associated with node 226. The BGA socket 210 has electrical connectors, often standard socket pins, 212 on one side for connecting to other devices. For one embodiment, the interconnect device 200 has electrical connectors 224 connected to the nodes 226 on the bottom side 240 at each site 222. For another embodiment, the interconnect system 200 has alignment pins 202 used to align the BGA socket 210 and the insulating substrate 220.

Figure 3:
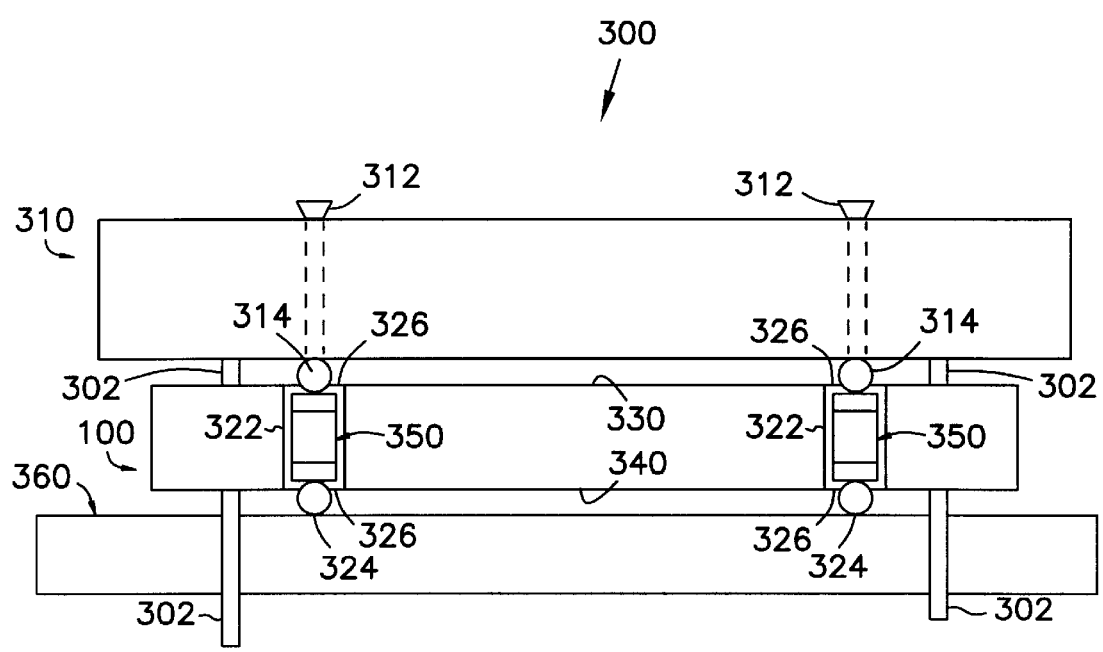
FIG. 3 is a side view of one embodiment of a circuit board interface system according to the present invention.

FIG. 3 is a side view of one embodiment of a circuit board interface system 300. For one embodiment, the circuit board interface system 300 has a circuit board 360, an interconnect device 100 and a BGA socket 310. For one embodiment, the circuit board 360 is a mother board of a personal computer or other processor-based system. The circuit board 360 has a number of signal paths (not shown) that carry signals. For one embodiment the signal paths are from a microprocessor bus. For another embodiment, the signal paths are from a memory data bus. The interconnect device 100 is connected to the circuit board 360 using electrical connectors 324. In one embodiment, as shown in FIG. 3, electrical connectors 324 are solder balls. In general, electrical connectors 324 can be any conductive material known to those of skill in the art. Each electrical connector 324 connects a node 326 on the bottom side 340 of the interconnect device 100 to one or more of the signal paths on the circuit board 360.The interconnect device includes the structure described above in conjunction with FIGS. 1A and 1B. The interconnect device 100 is connected to the BGA socket 310 using electrical contacts 314, usually standard solder ball connectors, on the BGA socket 310. For another embodiment, the BGA socket 310 is replaced by electrical connectors integrated onto the interconnect device 100. For one embodiment, the electrical connectors are similar to the standard socket pins on a BGA socket and perform substantially the same function. For another embodiment, the circuit board interface system 300 has alignment pins 302 used to align the BGA socket 310, the interconnect device 100 and the circuit board 360.

Figure 4:
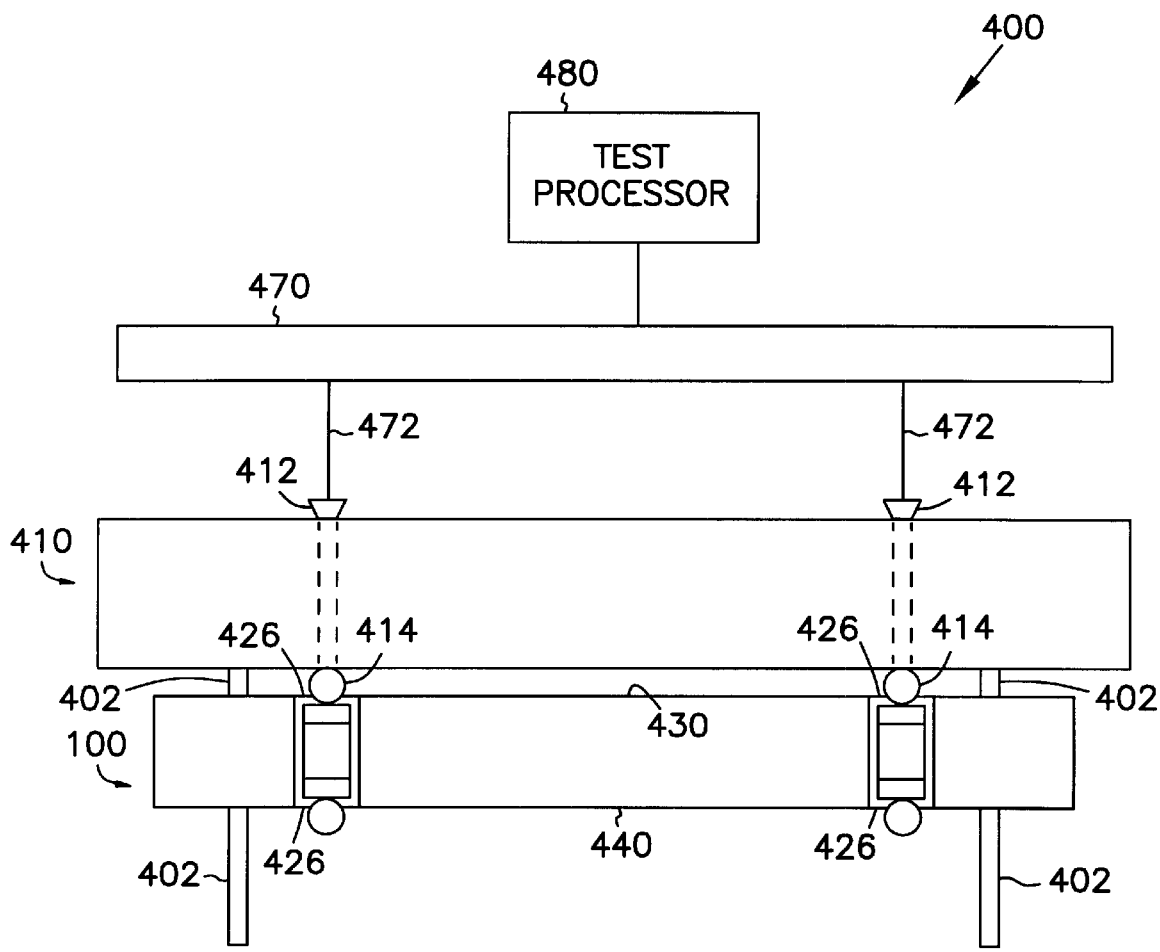
FIG. 4 is a side view of a test system according to the present invention.

FIG. 4 illustrates one embodiment of a test device 400 according to the present invention. The test device. 400, shown in FIG. 4, includes an interconnect device 100, a BGA adaptor 410, an instrumentation probe 470 having pins 472, and a test processor 480. The interconnect device 100 includes the structure described above in conjunction with FIGS. 1A and 1B.

For one embodiment, shown in FIG. 4, the instrumentation probe 470 is connected to the BGA socket 410 using the pins 472. Each pin 472 is connected to an electrical connector 412, typically a standard socket, on the BGA socket 410. The BGA socket 410 is connected to the interconnect device 100 by connecting the electrical contacts 414, usually standard solder ball connectors, on the BGA socket 410 to the nodes 426 on the top side 430 of the interconnect device 100. For another embodiment, the BGA socket 410 is replaced by electrical connectors integrated onto the top side 430 of the interconnect device 100 at each node 426. For one embodiment, the electrical connectors are similar to the standard socket pins on a BGA socket and perform substantially the same function. For another embodiment, the test device 400 has alignment pins 402 used to align the BGA socket 410 and the interconnect device 100.

One embodiment of the present invention is a method for testing an integrated circuit. In the test method, a test probe is connected to an adapter. The adapter is an interconnect device that includes the structure described above in conjunction with FIGS. 1A and 1B. For another embodiment, the adapter is an interconnect system that includes the structure described above in conjunction with FIGS. 2A and 2B. The adapter is connected to the integrated circuit 460 to be tested. In connecting to the integrated circuit, the adapter is connected to signal paths on the integrated circuit that are to be tested. For one embodiment, the signal paths are from a microprocessor bus. For another embodiment, the signal paths are from a memory bus. The test probe is connected to a test unit. The test unit, through use of the probe and adapter, tests the integrated circuit. For one embodiment, testing involves observing signals on the signal paths. For another embodiment, testing involves driving signals onto the signal paths. For another embodiment, testing involves both observing and driving signals on the signal paths.

Thus the various embodiments of the invention described above provide an interconnect device for connecting a testing or other device to an integrated circuit. The interconnect device has an insulating substrate that houses a number of components. The components are aligned normally to the major sides of the insulating substrate. The normal alignment facilitates connecting a test device to an integrated circuit. The normal alignment of the components additionally allows for a high density array to be formed that, in turn, allows the interconnect device to be connected to high density signals. The normal alignment also allows for a short distance from the signals to be tested or connected to the test circuit or other device. The short distance significantly reduces any impact on signal performance associated with long interconnect lengths related to routing a signal out from a processor socket. Additionally, the normal alignment reduces the distance from a component to a test or other device. The reduced distance facilitates testing of, or interconnection to, high speed signals without introducing parasitics that degrade testing accuracy or circuit performance.

The interconnect device is also advantageous because it can use standard components. Standard components have relative uniformity that facilitates test probe isolation and circuit performance.

Complex circuits may also be implemented with the interconnect device. Complex circuits may be implemented by using multiple components at a single site of the insulating substrate. Complex circuits may also be implemented through interconnecting multiple sites or using multiple layers of insulating substrates. These complex circuits allow easier solutions for terminating signals, filtering signals, amplifying signals or any other complex circuit in a high density, high speed environment.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. A device to interconnect a first and a second unit each having multiple separate contacts, the device comprising:

an insulating substrate having first and second substantially parallel, planar surfaces, the insulating substrate having a plurality of holes passing through the insulating substrate such that a center line of each of the plurality of holes is substantially normal to the first and second planar surfaces; and a plurality of active or passive electrical components each having a body with first and second conductive interconnects located at ends of the body, the plurality of active or passive electrical components being located in the plurality of holes such that the first conductive interconnect of each of the plurality of active or passive electrical components is located proximate to the first planar surface so as to engage a separate contact of the first unit, and the second conductive interconnect of each of the plurality of active or passive electrical components is located proximate to the second planar surface so as to engage a separate corresponds contact of the second unit;

wherein at least two of the active or passive electrical components are electrically connected in series.

2. The interconnect device of claim 1, wherein the plurality of active or passive electrical components are selected from the group comprising resistors, capacitors, inductors and diodes.

3. The interconnect device of claim 1, wherein at least one of the plurality of holes contains a conductor.

4. The interconnect device of claim 1 where the at least two active or passive components are located in the same one of the holes.

5. The interconnect device of claim 1 where at least one active or passive electrical component of a first hole of the plurality of holes is electrically connected in parallel with at least on active or passive electrical component of a second hole of the plurality of holes.

6. The interconnect device of claim 5 where at least one of the plurality of holes contains a conductor.

7. A test device for an integrated circuit having multiple separate contacts, the device comprising:

an insulating substrate having first and second substantially parallel, planar surfaces, the insulating substrate having a plurality of holes passing through the insulating substrate such that a center line of each of the plurality of holes is substantially normal to the first and second planar surfaces;

a plurality of active or passive electrical components each having a body with first and second conductive interconnects located at distal ends of the body, the plurality of active or passive electrical components being located in the plurality of holes such that the first conductive interconnect of each of the plurality of active or passive electrical components is located proximate to the first planar surface and electrically isolated from others of the first interconnects, and the second conductive interconnect of each of the plurality of active or passive electrical components is electrically isolated from others of the second interconnects, and is located proximate to the second planar surface so as to engage the separate contacts of the integrated circuit;

a test processor; and an instrumentation probe connected to the test processor having a plurality of pins, wherein each pin is connected to the first conductive interconnect of one of the active or passive electrical components in one of the plurality of holes of the insulating substrate in a one-to-one relationship.

8. The test device of claim 7 where the plurality of active or passive electrical components are selected from the group comprising resistors, capacitors, inductors and diodes.

9. The test device of claim 7 where at least one of the plurality of holes contains a conductor.

10. The test device of claim 7 where at least two of the active or passive electrical components are electrically connected in series.

11. The test device of claim 7 where at least one active or passive electrical component of a first hole of the plurality of holes is electrically connected in parallel with at least one active or passive electrical component of a second hole of the plurality of holes.

12. A method for testing an integrated circuit comprising:

connecting a plurality of separate test probes to an adapter wherein the adapter comprises:

an insulating substrate having first and second substantially parallel, planar surfaces, the insulating substrate having a plurality of holes passing through the insulating substrate such that a center line of each of the plurality of holes is substantially normal to the first and second planar surfaces;

a plurality of active or passive electrical components each having a body with first and second conductive interconnects located at distal ends of the body, the plurality of active or passive electrical components being located in the plurality of holes such that the first conductive interconnect of each of the plurality of active or passive electrical components is located proximate to the first planar surface and electrically isolated from others of the first interconnects, and the second conductive interconnect of each of the plurality of active or passive electrical components electrically isolated from others of the second interconnects, and is located proximate to the second planar surface so as to engage the separate contacts of the integrated circuit;

connecting the adapter to the integrated circuit using the second plurality of electrically isolated interconnects;

connecting the adapter to the separate test probes using corresponding ones of the first plurality of electrically isolated interconnects; and testing the integrated circuit using a test unit attached to each of the test probes.

13. The method of claim 12 where connecting the test probes comprises connecting each of the test probes to a different one of the electrically isolated interconnects.

14. The method of claim 12 where the plurality of active or passive electrical components are selected from the group comprising resistors, capacitors, inductors and diodes.

15. The method of claim 12 where at least one of the plurality of holes contains a conductor.

16. The method of claim 12 where at least two of the active or passive electrical components are electrically connected in series.

17. The method of claim 12 where at least one active or passive electrical component of a first hole of the plurality of holes is electrically connected in parallel with at least one active or passive electrical component of a second hole of the plurality of holes.

18. A circuit board interface system for an external unit having multiple contacts, comprising:

an insulating substrate having first and second substantially parallel, planar surfaces, the insulating substrate having a plurality of holes passing through the insulating substrate such that a center line of each of the plurality of holes is substantially normal to the first and second planar surfaces; and a plurality of active or passive electrical components each having a body with first and second conductive interconnects located at distal ends of the body, the plurality of active or passive electrical components being located in the plurality of holes such that the first conductive interconnect of each of the plurality of active or passive electrical components is electrically isolated from the first interconnects of others of the active or passive components, and is located proximate to the first planar surface, and the second conductive interconnect of each of the plurality of active or passive electrical components is electrically isolated from the second interconnects of others of the active or passive components, and is located proximate to the second planar surface so as to engage a corresponding separate contact of the external unit;

a circuit board having a plurality of separate signal paths, each signal path connected to one of the plurality of electrically isolated first interconnects.

19. The interface system of claim 18, wherein the plurality of active or passive electrical components are selected from the group comprising resistors, capacitors, inductors and diodes.

20. The interface system of claim 18, wherein at least one of the plurality of holes contains a conductor.

21. The interface system of claim 18 where at least two of the active or passive electrical components are electrically connected in series.

22. the interface system of claim 18 where at least on active or passive electrical component of a first hole of the plurality of holes is electrically connected in parallel with at least one active or passive electrical component of a second hole of the plurality of holes.

23. A device to interconnect a first and a second unit each having multiple electrically isolated contacts, the device comprising:

an insulating substrate having first and second substantially parallel planar surfaces, the insulating substrate having a plurality of holes passing therethrough such that each of the plurality of holes is substantially normal to the first and second planar surfaces;

a plurality of active or passive electrical components each having a body with first and second conductive interconnects located at ends of the body, the first interconnects of the active or passive components are electrically isolated from each other, and are located proximate to the first planar surface so as to releasably engage the separate contacts of the first unit, the second interconnects of the active or passive components are electrically isolated from each other, and are located proximate to the second planar surface so as to releasably engage the separate contacts of the second unit.

24. The interconnect device of claim 23 further comprising a plurality of mutually electrically isolated connectors interposed between the first interconnects of the active or passive components and the contacts of the first unit.

25. The interconnect device of claim 24 where the connectors are solder balls.

26. The interconnect device of claim 24 further comprising another plurality of mutually electrically isolated connectors connected to the second interconnects of the active or passive components.

27. The interconnect device of claim 26 where the other connectors are solder.

28. The interconnect device of claim 23 where the some active or passive components are selected from the group comprising resistors, capacitors, inductors and diodes.

29. A device to interconnect a first and a second unit each having multiple separate contacts, the device comprising:

a first insulating substrate having first and second substantially parallel planar surfaces and having a first plurality of holes passing therethrough such that each of the first plurality of holes is substantially normal to the first and second planar surfaces;

a first plurality of active or passive electrical components each having a body with first and second conductive interconnects located at its ends, the first plurality of active or passive components being located in at least some of the first plurality of holes such that the first interconnects are located proximate to the first surface so as to engage separate contacts of the first unit, and the second interconnects are located proximate to the second surface;

a second insulating substrate having third and fourth substantially parallel planar surfaces and having a second plurality of holes passing therethrough such that each of the second plurality of holes is substantially normal to the third and fourth planar surfaces, the third surface being substantially parallel to the second surface of the first substrate;

a second plurality of active or passive electrical components each having a body with third and fourth conductive interconnects located at its ends, the second plurality of active or passive components located in at least some of the second plurality of holes such that the third interconnects are located proximate to the third surface, and the fourth interconnects are located proximate to the fourth surface so as to engage respective separate contacts of the second unit;

a plurality of connectors located between the second and third surfaces each of the connectors electrically connecting one of the second interconnects to one of the third interconnects.

30. The interconnect device of claim 29 where at least some of the connectors are in-line.

31. The interconnect device of claim 30 where the some connectors comprise solder balls located between the second and the third interconnects.

32. The interconnect device of claim 29 where at least one of the connector is offset.

33. The interconnect device of claim 29 where at least one of the active or passive components in the first plurality is connected in series with one of the active or passive components in the second plurality.

34. The interconnect device of claim 29 where at least one of the active or passive components in the first plurality is connected in parallel with one of the active or passive components in the second plurality.

35. The interconnect device of claim 29 where the second surface is proximate to the third surface.

36. The interconnect device of claim 35 where each of the connectors directly connects the one second interconnect to the one third interconnect.

* * * * *

UNITED STATES PATENT AND TRADEMARK OFFICE
CERTIFICATE OF CORRECTION

PATENT NO.    : 6,529,385 B1                                                Page 1 of 1
DATED         : March 4, 2003
INVENTOR(S)   : Gary W. Brady et al.

It is certified that error appears in the above-identified patent and that said Letters Patent is hereby corrected as shown below:

Column 1,
Line 62, delete "," after "the".

Column 3,
Line 62, delete "," after "to".

Column 5,
Line 4, delete "-" after "122".
Line 27, delete ";" after "addition" and insert -- , -- therefor.
Line 29, delete "senes" and insert -- series -- therefor.
Line 30, delete "either'" and insert -- either -- therefor.
Line 34, insert -- a -- after "where".
Line 35, delete "122" and insert -- 122' -- therefor.
Line 37, insert -- substrates -- after "insulating".

Column 8,
Line 18, insert -- , -- after "Thus".

Column 11,
Line 26, delete "the" and insert -- The -- therefor.

Signed and Sealed this

Twenty-first Day of October, 2003

JAMES E. ROGAN
*Director of the United States Patent and Trademark Office*